United States Patent [19]
Fujiki et al.

[11] Patent Number: 5,736,791
[45] Date of Patent: Apr. 7, 1998

[54] SEMICONDUCTOR DEVICE AND BONDING PAD STRUCTURE THEREFOR

[75] Inventors: Noriaki Fujiki; Takashi Yamashita, both of Hyogo, Japan

[73] Assignee: Mitsubishi Denki Kabushiki Kaisha, Tokyo, Japan

[21] Appl. No.: 479,205

[22] Filed: Jun. 7, 1995

[30] Foreign Application Priority Data

Feb. 7, 1995 [JP] Japan .................. 7-019212

[51] Int. Cl.⁶ .................. H01L 23/48; H01L 23/52; H01L 23/40
[52] U.S. Cl. .................. 257/781; 257/698
[58] Field of Search .................. 257/780, 781, 257/786, 784, 698

[56] References Cited

U.S. PATENT DOCUMENTS

| | | | |
|---|---|---|---|
| 5,149,674 | 9/1992 | Freeman, Jr. et al. | |
| 5,248,903 | 9/1993 | Heim | 257/781 |
| 5,291,062 | 3/1994 | Higgins, III | 257/698 |
| 5,367,435 | 11/1994 | Andros et al. | 257/779 |
| 5,475,236 | 12/1995 | Yoshizaki | 257/786 |

FOREIGN PATENT DOCUMENTS

| | | |
|---|---|---|
| 2-68944 A2 | 3/1990 | Japan . |
| 2-189925 A2 | 7/1990 | Japan . |
| 3-22436 A2 | 1/1991 | Japan . |
| 3-149824 A2 | 6/1991 | Japan . |
| 3-149831 A2 | 6/1991 | Japan . |
| 5-243320 | 9/1993 | Japan . |
| 5-343466 | 12/1993 | Japan . |

Primary Examiner—Stephen Meier
Assistant Examiner—S. V. Clark
Attorney, Agent, or Firm—Lowe, Price, LeBlanc & Becker

[57] ABSTRACT

In a semiconductor device having a bonding pad structure of a multilayered wiring structure comprising a first wiring layer and a second wiring layers which is located over the first wiring layer and an interlayer insulation layer between the wiring layers which has an electrically conductive component so as to electrically connect the wiring layers, the bonding pad structure is such that no crack is formed in the interlayer insulation layer during wire bonding.

The bonding pad structure is so arranged that an area of the first wiring layer area is smaller than that of the second wiring layer or the first wiring layer is formed outside a bonding region of the second wiring layer under the second wiring layer.

14 Claims, 9 Drawing Sheets

SEMICONDUCTOR DEVICE AND BONDING PAD STRUCTURE THEREFOR

BACKGROUND OF THE INVENTION

1. Field of the Invention

The present invention relates to a semiconductor device comprising at least two wiring layers, and in particular to a bonding pad structure for such a semiconductor device.

2. Description of the Related Art

Figure 9:
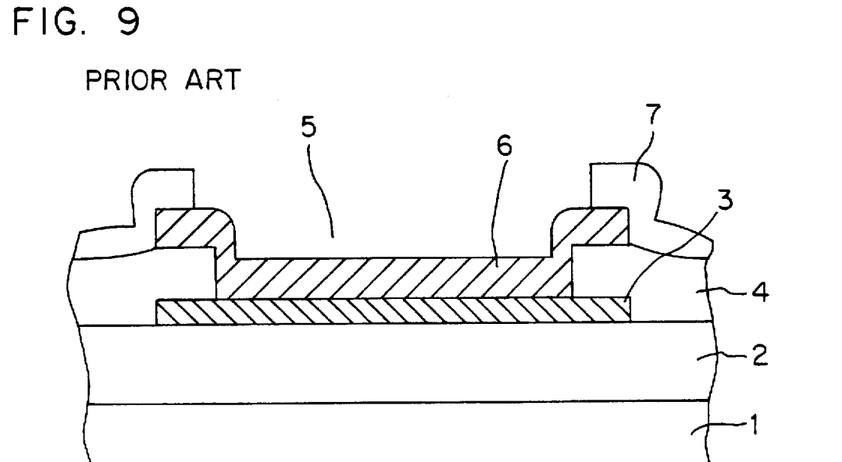
FIG. 9 schematically shows a cross-sectional view of a bonding pad of the prior art.
Figure 10:
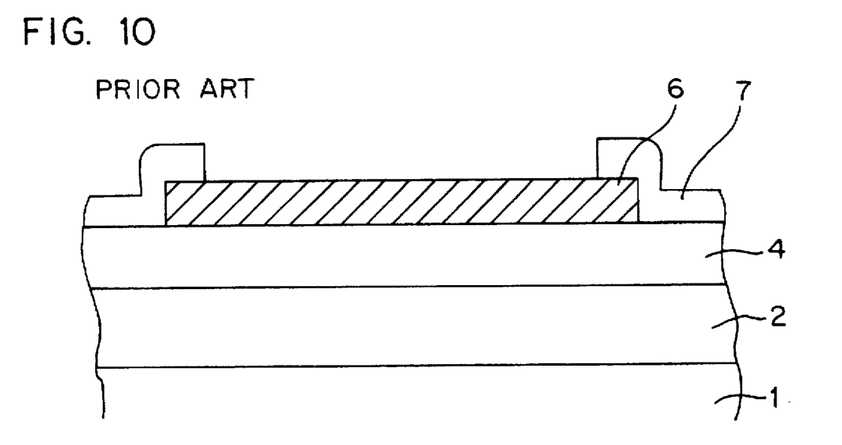
FIG. 10 schematically shows a cross-sectional view of another bonding pad of the prior art.

Wiring has been made minute and multi-layered with trends of highly integration and multi-functions of a semiconductor device, and a multi-layered wiring technique has been more and more important. FIGS. 9 and 10 schematically show, as examples, cross-sectional views of a bonding pad structure for the semiconductor device of the prior art which has a two wiring layer structure, respectively.

FIG. 9 shows one example of a structure in which a first Al wiring layer and a second Al wiring layer are overlapped while FIG. 10 shows one example of a structure which contains only a second Al wiring layer. In those drawings, a bonding pad structure comprises a substrate (1) such as a silicon substrate, a first interlayer insulating layer (2), the first Al wiring layer (3) (which is present only in FIG. 9), a second interlayer insulating layer (4), a via hole (5), the second Al wiring layer (6) and a passivation film (7). Bonding pad structures are, in principle, classified into these two types; namely one structure in which the first Al wiring layer (3) is overlapped with the second Al wiring layer (6) as shown in FIG. 9 and the other structure which includes only the second Al wiring layer (6) as a top wiring layer as shown in FIG. 10.

Upon comparison of these two types of the structures, a via hole which connects the first Al wiring layer to the second Al wiring layer has to be provided in an area (not shown) other than the bonding pad structure when the structure of FIG. 10 is employed. This increases a semiconductor tip area, which is disadvantageous for a highly integrated semiconductor tip. On the other hand, when the structure of FIG. 9 is employed, a relatively large via hole (5) which connects the first Al wiring layer (3) with the second Al wiring layer (6) can be formed within the bonding pad structure, which is advantageous for the highly integrated semiconductor tip. Therefore, the structure as shown in FIG. 9 is likely to be employed for most semiconductor devices of which tip size is limited in particular by means of a wiring area.

The structure shown in FIG. 9 will be, hereinafter, explained in detail below. It is to be noted that, in principle, a reference number used for a component in a drawing and/or a description throughout the instant specification is used in the other drawings and/or descriptions to indicate a component which is the same as the component in the drawing and/or the description.

Figure 11:
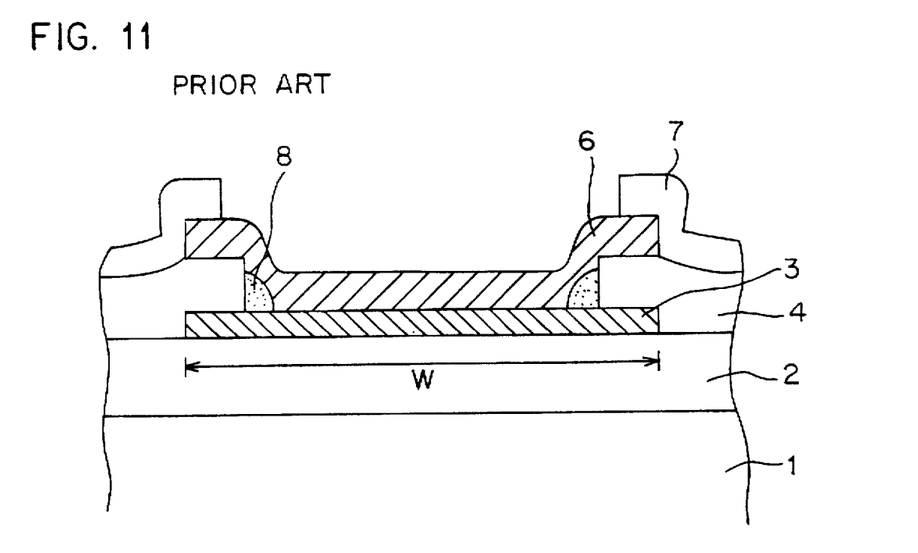
FIG. 11 schematically shows a cross-sectional view of a bonding pad of the prior art for the purpose of explanation of a problem.

A recent tendency to make a pitch in the wiring pattern has been so remarkable. With such a tendency, via holes filled with plugs of tungsten is generally used as a structure for a via hole (present in other than the bonding pad structure) which connects wiring layers. FIG. 11 schematically shows a cross-sectional view of a typical bonding pad structure formed for the production of the semiconductor device which has the via holes filled with the tungsten plugs in a portion other than the bonding pad structure portion of the device.

In FIG. 11, a portion of the tungsten plug (8) which has not been removed by an etching step so that it still remains in the bonding pad structure. In the shown embodiment, a size of a first Al wiring layer (3) and a second Al wiring layer (6) (i.e. a length of "w" in FIG. 11) is generally about 100 μm and thus an opening size of a via hole is in such an order.

Then, a production process for the bonding pad structure as shown in FIG. 11 will be explained with reference to the accompanying drawings of FIGS. 12 to 15.

Figure 12:
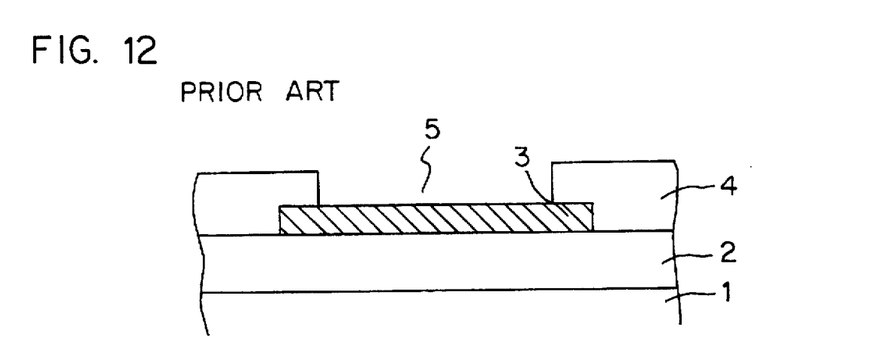
FIG. 12 schematically shows a cross-sectional view of a bonding pad of the prior art for the purpose of explanation of a problem.

Firstly, a first interlayer insulation layer (2) is formed on a silicon substrate (1) by the CVD method, as shown in FIG. 12. Then, an Al film is formed on the first interlayer insulation layer (2) by, for example, the sputtering method and the Al film is patterned to obtain a first Al wiring layer (3). Thereafter, a second interlayer insulation layer (4) is formed over a whole of the first Al wiring layer (3) by combination of the plasma CVD method or the SOG (Spin on Glass) method with etch-backing using the dry etching method. A resist is applied on the second interlayer insulation layer (4), which is patterned with the photo-lithography to form a via hole pattern followed by etching the second interlayer insulation layer (4) to form an opening with using the resist as a mask by means of the reactive ion etching (RIE) method. Finally, the resist is removed by, for example, oxygen plasma to obtain a via hole (5) (as a structure shown in FIG. 12).

Figure 13:
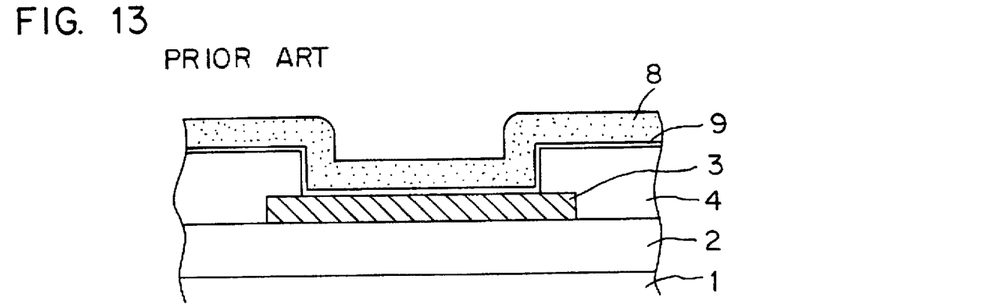
FIG. 13 schematically shows a cross-sectional view of a bonding pad of the prior art for the purpose of explanation of a problem.

Then, as shown in FIG. 13, a titanium nitride film (9) (which is, hereinafter, sometimes referred to as a "TiN film") is formed over a whole of the second interlayer insulation layer (4) providing the via hole (5) and the exposed first Al wiring layer (3). The TiN film (9) functions as a layer making a tungsten film tightly attach to the second interlayer insulation layer (4). Then, the tungsten film (8) having a thickness of about 1000 to 10000 Å is formed on a whole of the TiN film (9) to have a structure as shown in FIG. 13.

Then, the tungsten film (8) is etched back using the dry etching method. Such etching back should be so carried out that no tungsten film (8) is left except in the via hole portion. When the etching back is carried out, there are two methods: One is referred to as "Stop on TiN" method in which the TiN film (9) is left, and the other is referred to as "Stop on Oxide" method in which the etching back is continued so as to remove also the TiN film (9).

Figure 14:
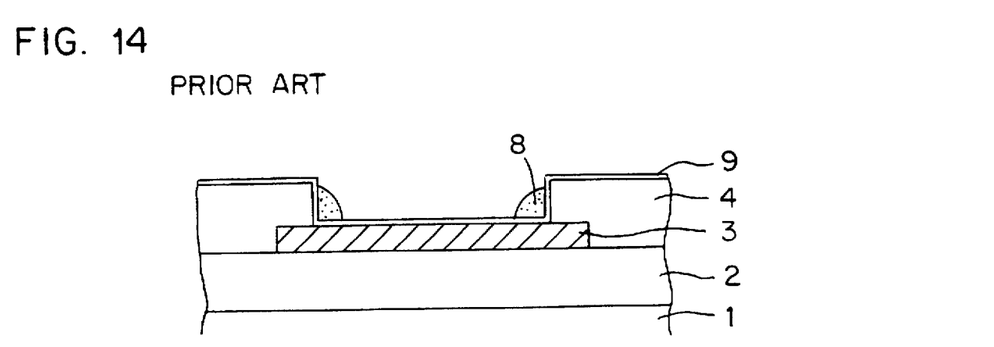
FIG. 14 schematically shows a cross-sectional view of a bonding pad of the prior art for the purpose of explanation of a problem.

FIG. 14 schematically shows a cross-sectional view of an intermediate of a bonding pad structure in which the "Stop on TiN" method has been carried out. In the case wherein the tungsten film (8) is etched back according to the "Stop on TIN" method, when a broad opening is present as in the via hole (5) located in the bonding pad structure, the tungsten film (8) is left in a wall-like form at each edge portion (or a peripheral portion) of the via hole while no tungsten film is left in a center portion of the opening.

Figure 15:
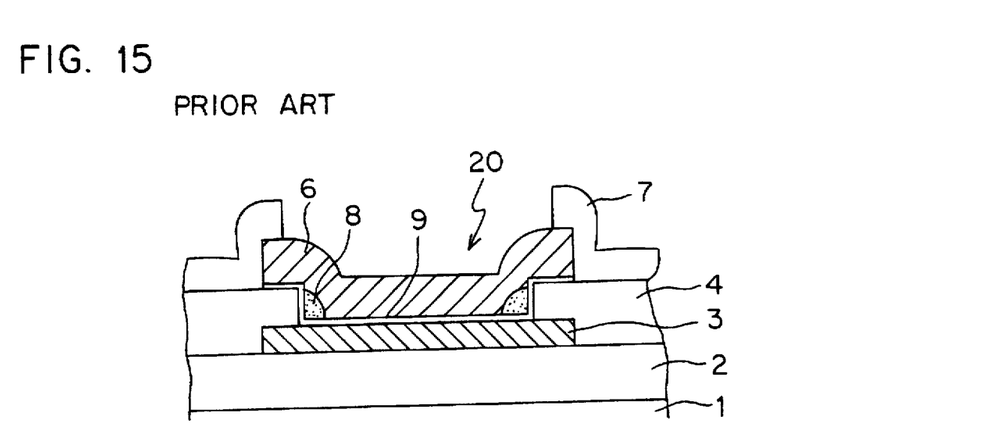
FIG. 15 schematically shows a cross-sectional view of a bonding pad of the prior art for the purpose of explanation of a problem.

Thereafter, an Al film is formed over all surfaces of the TiN film (9) and the tungsten film (8) followed by pattern formation of a second Al wiring layer (6) using the photo-lithography and the RIE method. A silicon nitride film which is to be a passivation film (7) is then formed over all surfaces of the second Al wiring layer (6) and the second interlayer insulation layer (4) using the plasma CVD method, and an opening is formed only over the bonding pad structure portion (20) by the photo-lithography and the dry etching to have a structure as shown in FIG. 15.

As described above, when the tungsten film is etched back using the "Stop on TiN" method, the tungsten film broadly remains at the edge portions or the peripheral portions of the via hole in the wall-like form, and such tungsten film (8) is likely to be peeled off into small pieces and the pieces lead to dust and/or cause, for example, short circuit problems which results in the production of rejected semiconductor devices. Thus, since the "Stop on TiN" method is likely to make the production yield worse, it is not so preferred.

Figure 16:
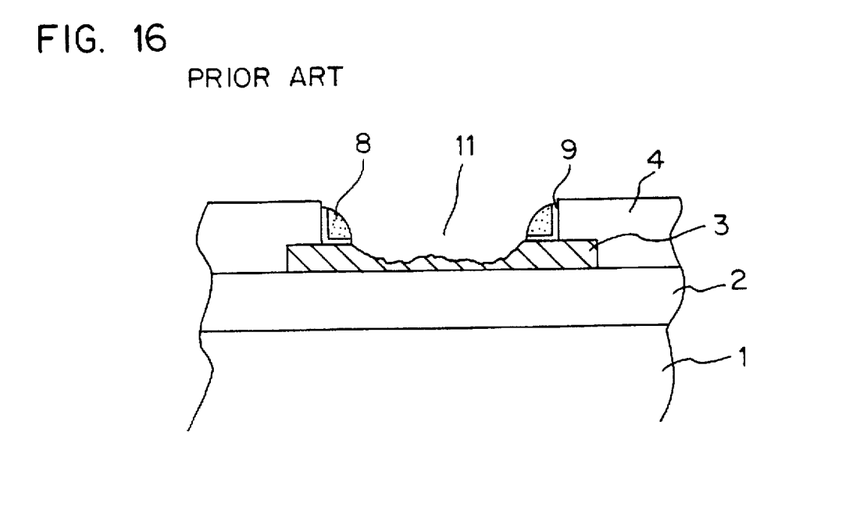
FIG. 16 schematically shows a cross-sectional view of a bonding pad of the prior art for the purpose of explanation of a problem.

In the case of the "Stop on Oxide" method, the tungsten film (8) and then the TiN film (9) are etched back as shown in FIG. 16. In most cases, a chlorine based gas such as chlorine gas ($Cl_2$) is used for etching back the TiN film. The gas also etches aluminum which constitutes the wiring layers. Therefore, when the "Stop on Oxide" method is used for the production of the bonding pad structure of the multilayered wiring structure, the first Al wiring layer (3) as a base is etched in the center portion of the opening (11) for the broad via hole (5) to be blacked so that identification of the wiring pattern is impossible and wiring reliability thus is adversely affected.

Figure 17:
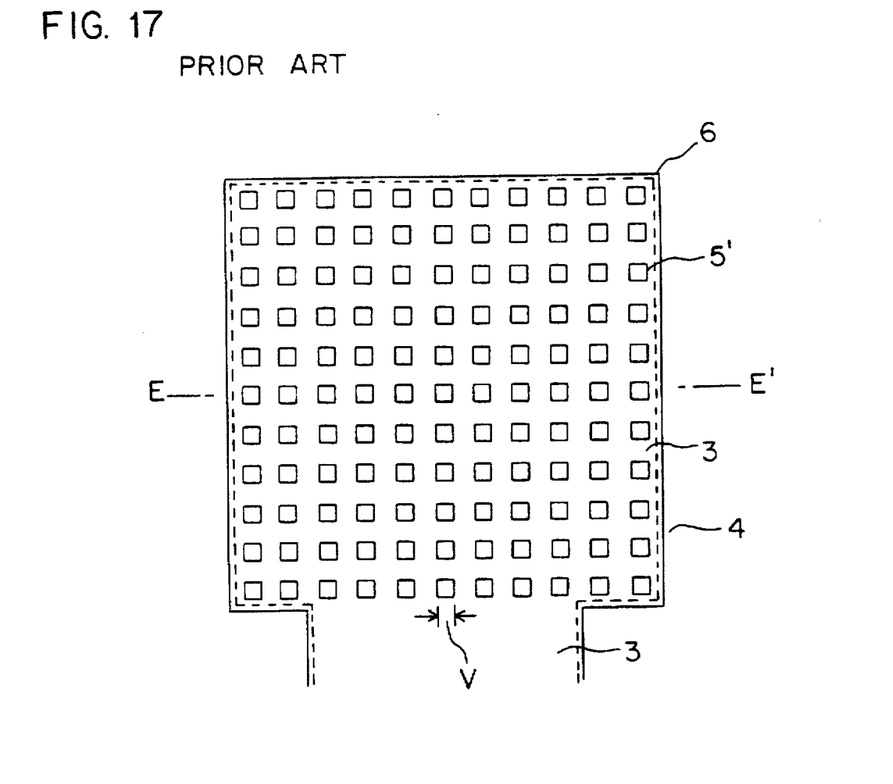
FIG. 17 schematically shows a cross-sectional view of a bonding pad of the prior art for the purpose of explanation of a problem.
Figure 18:
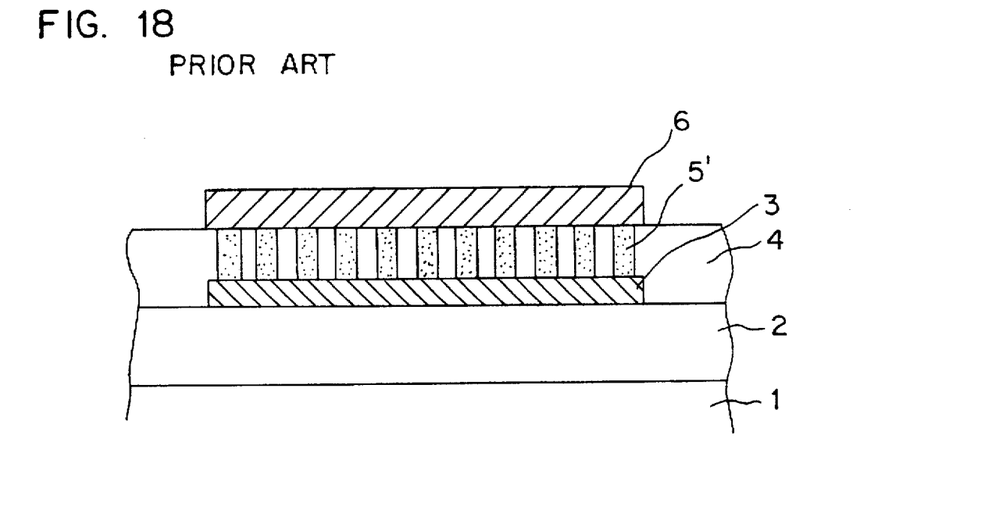
FIG. 18 schematically shows a cross-sectional view of a bonding pad of the prior art for the purpose of explanation of a problem.

As a bonding pad structure which overcomes the problems described above, there has been developed a bonding pad structure as schematically shown in FIGS. 17 and 18. Concretely, reference can be made to Japanese Patent Kokai Publication No. 5-343,466 and U.S. Pat. No. 5,149,674. FIG. 17 schematically shows a layout plane view of the bonding pad structure portion (20), and FIG. 18 schematically shows a cross-sectional view taken along a line E–E' in FIG. 17.

In the embodiment shown in FIGS. 17 and 18, a large single via hole (5) is divided into a plurality of small via holes (5'), which are used in place of the large single via hole(5). Each small via hole (5') has such a size (e.g. a side length "v" of a square in the embodiment shown in FIG. 17) that no tungsten film is removed form an opening of each via hole (5') (i.e. no wiring layer underlying the tungsten film is exposed) even when the etching back method is used so as to remove the tungsten film on the insulation layer as described above, and generally the size is equal to or not larger than twice as large as a deposition thickness of the tungsten film. By employing such a structure, a is normal tungsten plug structure (namely, no Al layer or TiN film is exposed) is provided so that the peeling off problem of the tungsten film is not caused.

Another problem, however, have been caused when the structure shown in FIGS. 17 and 18 is employed. The problems will be explained below with reference to FIG. 19.

Figure 19:
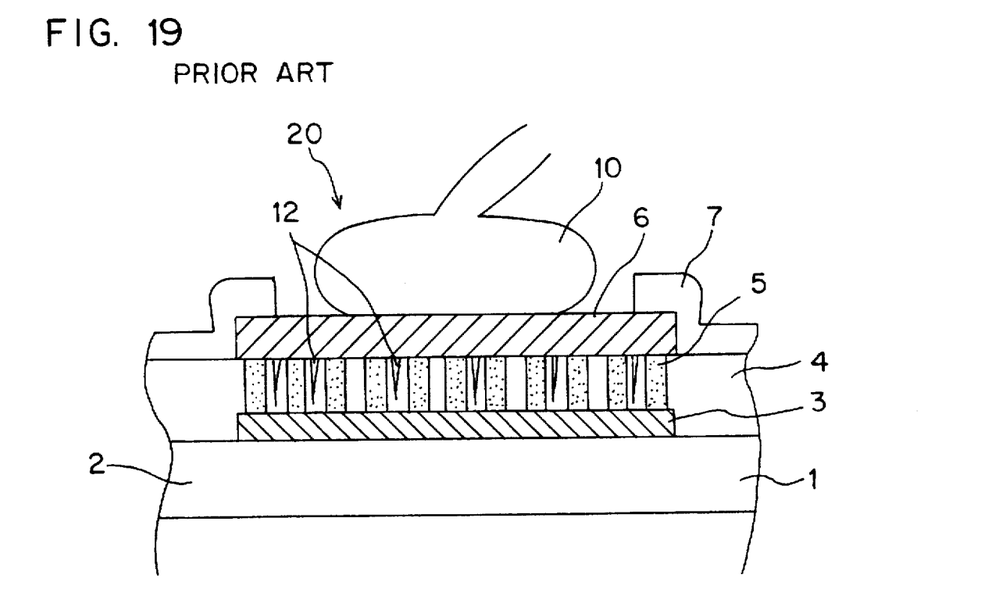
FIG. 19 schematically shows a cross-sectional view of a bonding pad of the prior art for the purpose of explanation of a problem.

A semiconductor device is finally packed in a plastic or ceramic package, and when so packed, the bonding pad portion (20) should be connected with a lead frame of the package with a bonding wire (10). As such a wire (10), aluminum or gold made wire is usually used. When the connection (i.e. wire bonding) is carried out, there newly arises a problem that cracks (12) are caused in a second interlayer insulation layer (4) of the bonding pad portion (20).

It is believed that those cracks are caused by supersonic which is applied for tight bonding of the wire (10) to the second Al layer (6) during the wire bonding. That is, upon the application of vibration of the supersonic, a relatively softer material, namely the first Al wiring layer (3) and the second Al wiring layer (6) tend to deform so as to relieve a stress through the supersonic, while the second interlayer insulation layer (4) cannot be deformed and it is, then, broken by a force beyond a certain extent since it is of a relatively rigid material, whereby the cracks (12) are caused.

Since the tight bond of the wire (10) to the second wiring layer (6) is concerned with reliability of the semiconductor device, the ultrasonic has to be applied beyond a certain extent so as to ensure the sufficiently tight bonding. However, when the bonding pad structure shown in FIGS. 17 and 18 is employed, it is very difficult to ensure the tight bonding without formation of the cracks. When such cracks are formed, water vapor can intrude into the inside of the device through the cracks, which causes a severe problem concerning the device reliability that the water vapor adversely affects a performance of the device.

It is to be noted that no crack is formed when the structure as shown in FIG. 10 is employed in which the bonding pad comprises only the second Al wiring layer (a top Al wiring layer). Not bound by any theory, this is because no first Al wiring layer is present under the second Al wiring layer so that no force due to the deformation of the wiring layer is transferred to a portion beneath the underlying interlayer insulation layer and also because the relatively large second Al wiring layer can relief the stress due to the supersonic.

SUMMARY OF THE INVENTION

It is, therefore, an object of the present invention to provide a highly reliable semiconductor device having a multilayered wiring structure which overcomes the problems as described above, especially which causes no crack described above even when wire bonding is applied using supersonic.

According to a first aspect, the present invention provides a semiconductor device having a bonding pad portion of a multilayered wiring structure comprising at least a first and a second wiring layers and at least one interlayer insulation layer between the wiring layers which has at least one via hole filled with an electrically conductive component so as to electrically connect the wiring layers, characterized in that (1) the first wiring layer has a wiring pattern including slit portions, (2) the interlayer insulation layer is located on the first wiring layer and fills the slit portions of the wiring pattern, and the via hole contained in the interlayer insulation is located on the first wiring layer, and (3) the second wiring layer is formed on the interlayer insulation layer so that it is electrically connected with the first wiring layer through the via hole, and functions as a pad electrode for electrical input or output with the outside of the semiconductor device.

In the semiconductor device according to the present invention, the wiring layer is intended to mean a laminar thin wiring means which is generally used for wiring of the conventional semiconductor device. Also, that the wiring layer includes the slit portions means that, in a planar wiring layer, there are partially openings and/or slots through the layer. There is no specific limitation on a shape of the openings (or the slots). The slit portions are filled with an electrically insulating component of the interlayer insulation layer. In addition, the via hole is intended to mean a passing-through-space (or a pore) which is formed through the interlayer insulation layer and which connects the first wiring layer and the second wiring layer. The space is filled with the electrically conductive component so that the first wiring layer and the second wiring layer are electrically connected. A shape of the via hole is not particularly limited according to the reference to the term "hole", and any shape may be selected for the via hole.

In the semiconductor device according to the present invention, one or more additional wiring layer(s) may be optionally present under the first wiring layer through one or more additional insulation layer(s). Electrical connection between these additional wiring layers or between the first wiring layer and the additional wiring layer just below it may be carried out with at least one conventional via hole.

In a second aspect, the present invention provides a semiconductor device having a bonding pad portion of a multilayered wiring structure comprising at least a first and a second wiring layers and at least one interlayer insulation layer between the wiring layers which has at least one via hole filled with an electrically conductive component so as to electrically connect the wiring layers, characterized in that (1) the second wiring layer is formed on the interlayer insulation layer, and functions as a pad electrode having a bonding region for electrical input or output with the outside of the semiconductor device, (2) the via hole contained in the interlayer insulation layer is located beneath the second wiring layer outside the bonding region, and (3) the first wiring layer has a wiring pattern beneath the via hole, but it has no wiring pattern under the bonding region.

In the present invention, the bonding region is intended to mean one region of the second wiring layer with and to which region a bonding wire is contacted and bonded when the wire is used for wire bonding so as to connect the boding pad to a lead frame. The bonding region is usually a circular area in a center portion of the second wiring layer of the bonding pad structure. In the semiconductor device of the second aspect, there is no wiring pattern of the first wiring layer under the bonding region and the first wiring layer is present under the second wiring layer only outside a peripheral area of the bonding region. Such a structure is substantially the same as the structure without a crack described in the above with reference to FIG. 10 in which no first wiring layer is present under the second wiring layer. Thus, the formation of the cracks is suppressed and preferably prevented in the semiconductor device of the second aspect of the present invention.

DETAILED DESCRIPTION OF THE INVENTION

In the semiconductor device of the first aspect according to the present invention, the provision of the slit portions for the first wiring layer decrease an amount of a material used for the first wiring layer so that an area of the first wiring layer is also decreased. Practically, a total area of the first wiring layer in the bonding pad portion is not more than about 90%, preferably in a range of about 50 to 90% of a total area of the second wiring layer. Such slit portions are provided through the first wiring layer as uniformly as possible. In this way, an amount of deformation of the first wiring layer due to application of a stress formed upon the wire bonding is reduced and also distributed more uniformly over the first wiring layer, so that formation of the cracks in the interlayer insulation layer is suppressed and preferably prevented.

In a preferred embodiment of the first aspect according to the present invention, the via hole is present in a plural number (i.e. a plurality of the via holes) of which form may be a pillar such as a column, a prism and the like or a horizontally elongated form such as a groove-like form (namely, a lying member formed by laying down a standing pillar form). In a particularly preferred embodiment, the via holes are in the column forms or the polygonal prism forms, and in particular (equilateral) tetragonal prism forms which are regularly spaced from each other (thus, separated as evenly as possible).

Thus, when a plurality of the via holes are provided, those each having a smaller opening than that of the via hole which has been conventionally used for the bonding pad structure of the semiconductor device are more easily produced, so that the filling component in each via hole is not removed even by etching whereby the normal via hole structure can be maintained. In addition, when the via holes have a geometric configuration as described above, they can be distributed uniformly on the first wiring layer and the production of the via holes is facilitated, so that the semiconductor device is produced in which the formation of the cracks is further suppressed and preferably prevented in the interlayer insulation layer.

In another preferred embodiment of the first aspect according to the present invention, the slit portions are a plurality of rectangular and especially elongated rectangular pores (or spaces) passing through the first wiring layer, and it is preferable that the slit portions are regularly spaced from each other.

When the first wiring layer has such slit portions, the via holes can be evenly distributed beneath the second wiring layer and the production of the semiconductor device becomes easier.

In a preferred embodiment of the second aspect, the via hole is a plurality of the pillar forms or the horizontally elongated spaces filled with the conductive component as in the case of the first aspect. By using such a via hole structure, the normal via hole structure is ensured and a plurality of the via holes are uniformly distributed on the first wiring layer, and their production is facilitated, which results in the semiconductor device production in which the formation of the cracks in the interlayer insulation layer are suppressed and preferably prevented.

In another preferred embodiment of the second aspect, the via hole is formed beneath a peripheral portion of the second wiring layer (thus, edge portions of the second wiring layer) outside in the bonding region. Thus, since the periphery portion, namely the portion outside the bonding region a bonding function as a bonding region, such an arrangement of the via hole ensures that no first wiring layer is formed under the bonding region.

In a further preferred embodiment of the second aspect, the second wiring layer is substantially rectangular, and the via holes are formed in four corner portions of the second wiring layer which are inside the second wiring layer and which are outside the bonding region. The formation of the via holes in the four corner portions of the second wiring layer effectively utilizes portions of the second wiring layer which substantially do nothing with bonding while the formation ensures that no first wiring layer is present under the bonding region. It is to be noted that this embodiment may be combined with the embodiment in which the via holes are formed beneath the edge portions of the second wiring layer, so that the via holes may be formed beneath the both of the four corner portions and the edge portions.

In a third aspect, the present invention provides a bonding pad structure of a multilayered wiring arrangement comprising at least a first and a second wiring layers and at least one interlayer insulation layer between the wiring layers which has at least one via hole filled with an electrically conductive component so as to electrically connect the wiring layers, characterized in that (1) the first wiring layer has a wiring pattern including slit portions, (2) the interlayer insulation layer is located on the first wiring layer and fills the slit portions of the wiring pattern, and the via hole contained in the interlayer insulation is located on the first wiring layer, and (3) the second wiring layer is formed on the interlayer insulation layer so that it is electrically connected with the first wiring layer through the via hole, and functions as a pad electrode for electrical input or output with the outside of a semiconductor device.

In a particular preferred embodiment of the third aspect, the via hole is a plurality of pores formed through the interlayer insulation layer. A geometric configuration of each pore is a column or a prism form or a horizontally elongated form.

In a further particularly preferred embodiment of the third aspect, the slit portions are a plurality of horizontally elongated rectangular spaces through the first wiring layer which are filled with the electrically insulating component constituting the interlayer insulation layer.

In a fourth aspect, the present invention provides a bonding pad structure of a multilayered wiring arrangement and comprising at least a first and a second wiring layers and at least one interlayer insulation layer between the wiring layers which has at least one via hole filled with an electrically conductive component so as to electrically connect the wiring layers, characterized in that (1) the second wiring layer is formed on the interlayer insulation layer, and functions as a pad electrode having a bonding region for electrical input or output with the outside of the semiconductor device, (2) the via hole contained in the interlayer insulation layer is located beneath the second wiring layer outside the bonding region, and (3) the first wiring layer has a wiring pattern beneath the via hole, but it has no wiring pattern under the bonding region.

In a preferred embodiment of the fourth aspect, the via hole is a plurality of pores formed through the interlayer insulation layer. A geometric configuration of each pore is a column or a prism form or a horizontally elongated form.

In another preferred embodiment of the fourth aspect, the via holes are formed beneath edge portions of the second wiring layer.

In a further preferred embodiment of the fourth aspect, the second wiring layer is substantially rectangular and the via holes are formed beneath four corner portions of the second wiring layer.

The bonding pad structures of the third and the fourth aspects are used for the semiconductor devices of the first and the second aspects, respectively and have the features which have been described in relation with such semiconductor devices, respectively.

Action of the Invention

In the first and third aspects of the present invention, a volume of the wiring material and an area of the wiring layer is thus substantially smaller in the first wiring layer than the second wiring layer. Therefore, an amount of deformation of the first wiring layer upon application of a stress can be reduced, which suppresses and preferably prevents the crack formation in the interlayer insulation layer.

In the second and fourth aspects of the present invention, the first wiring layer is not substantially present under the bonding region, so that a structure is achieved which is similar to the bonding pad structure which includes only one wiring layer. Also in this case, the crack formation is suppressed and preferably prevented in the interlayer insulation layer.

DESCRIPTION OF THE PREFERRED EMBODIMENTS

The semiconductor device, and particularly the bonding pad structure according to the present invention will be, hereinafter, explained with reference to concrete embodiments and the accompanying drawings. It is to be noted that solid lines and broken lines in the drawings are used only for easier understanding of the present semiconductor device and the present bonding pad structure and that they are not intended to distinguish components which is directly visible from the outside from non-directly-visible components.

Embodiment 1

Figure 1:
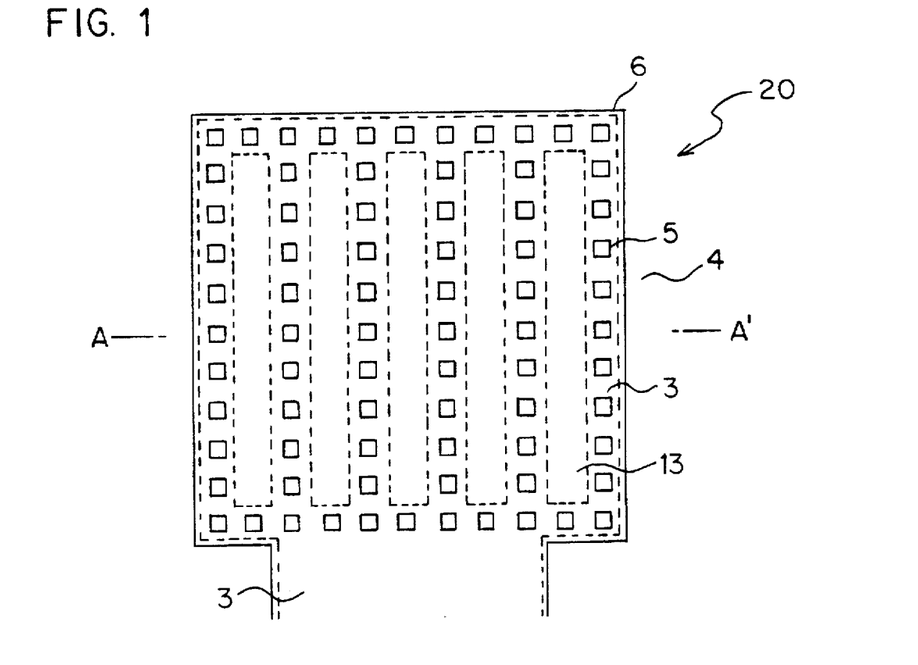
FIG. 1 schematically shows a layout pattern (a plane view) of a bonding pad portion of a semiconductor device of Embodiment 1.
Figure 2:
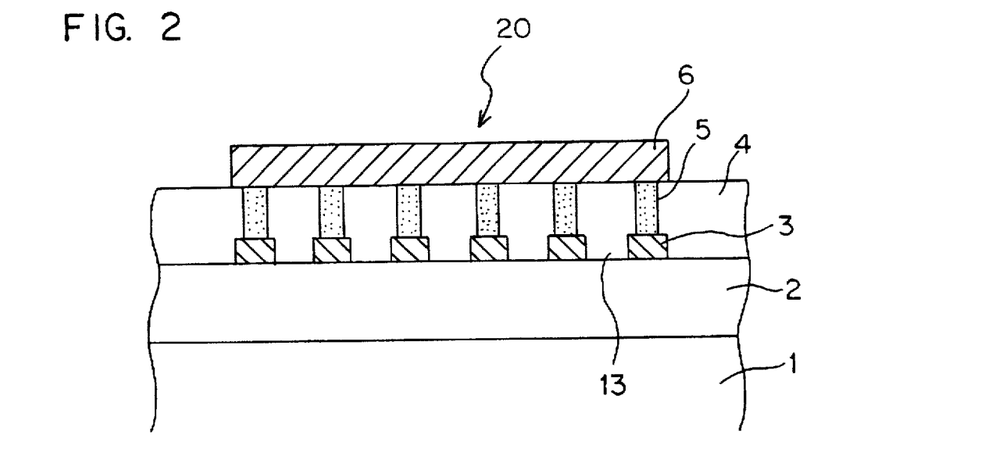
FIG. 2 schematically shows a cross-sectional view taken along a line A–A' in FIG. 1.
Figure 3:
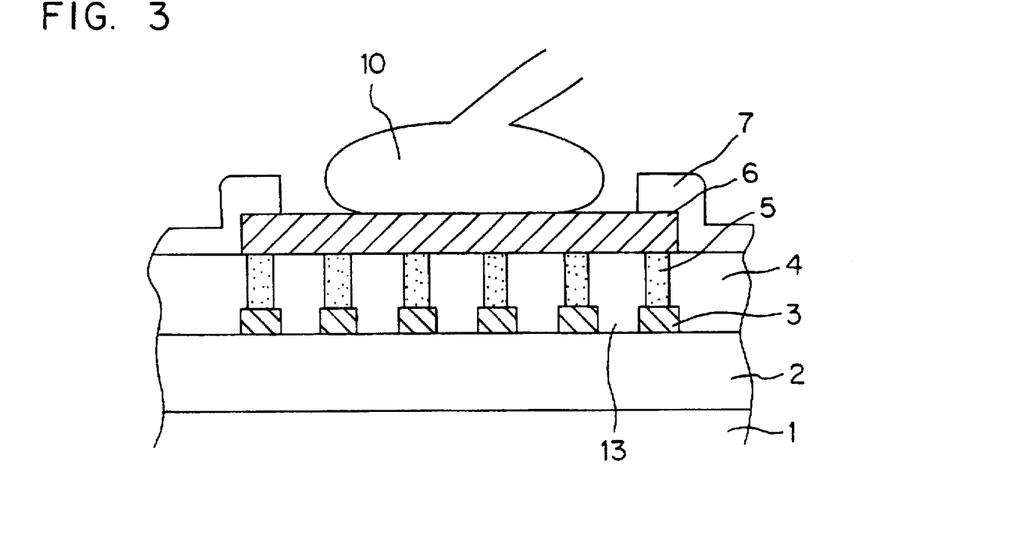
FIG. 3 schematically shows a cross-sectional view similar to FIG. 2 showing a state in which wire bonding is being carried out using the device of the Embodiment shown in FIG. 1.

A first concrete embodiment of the present invention is shown in FIGS. 1 and 2. FIG. 1 schematically shows a layout pattern (a top plane view) of the bonding pad portion (20) of the first concrete embodiment of the semiconductor device according to the present invention, and FIG. 2 schematically shows a cross-sectional view taken along a line A–A' in FIG. 1.

As clearly seen from FIGS. 1 and 2, a pattern of a first Al wiring layer (3) is of a stripe-like form in which slit portions (13) of elongated rectangular spaces (horizontally elongated tetragonal prisms) are formed through the wiring layer, and a plurality of via holes each having a rectangular cross-section are uniformly provided on the wiring layer, which are characteristics of Embodiment 1. With respect to the other features of Embodiment 1, they are substantially the same as those of the embodiment shown in FIG. 17.

By forming the first Al wiring layer (3), and thus the underlying Al wiring pattern into the stripe-like form, an amount of aluminum used as the first wiring layer (3) is reduced since no wiring layer is present in the slit portions (13), and thus a wiring area is reduced. In the embodiment as shown in FIG. 1, an area of the first wiring layer is about 70% of the second wiring layer. As a result, when the bonding pad is finally formed and the wire bonding is then carried out, an amount of the deformation of the first wiring layer (3) is reduced due to a stress during the wire bonding. Thus, with respect to the aluminum deformation due to the supersonic during the wire bonding, the deformation of at least the underlying Al wiring layer is suppressed to a minimum amount, which is quite different from the bonding pad structure of the prior art as shown in FIG. 19 in which the deformation amount is large in each of the underlying and the upper Al wiring layers, whereby no crack occurs in the second interlayer insulation layer (4).

Therefore, no crack is formed in the bonding pad structure of Embodiment 1, and sufficiently tight bonding of the wire (10) to the second Al wiring layer (6) is obtained.

Embodiment 2

Figure 4:
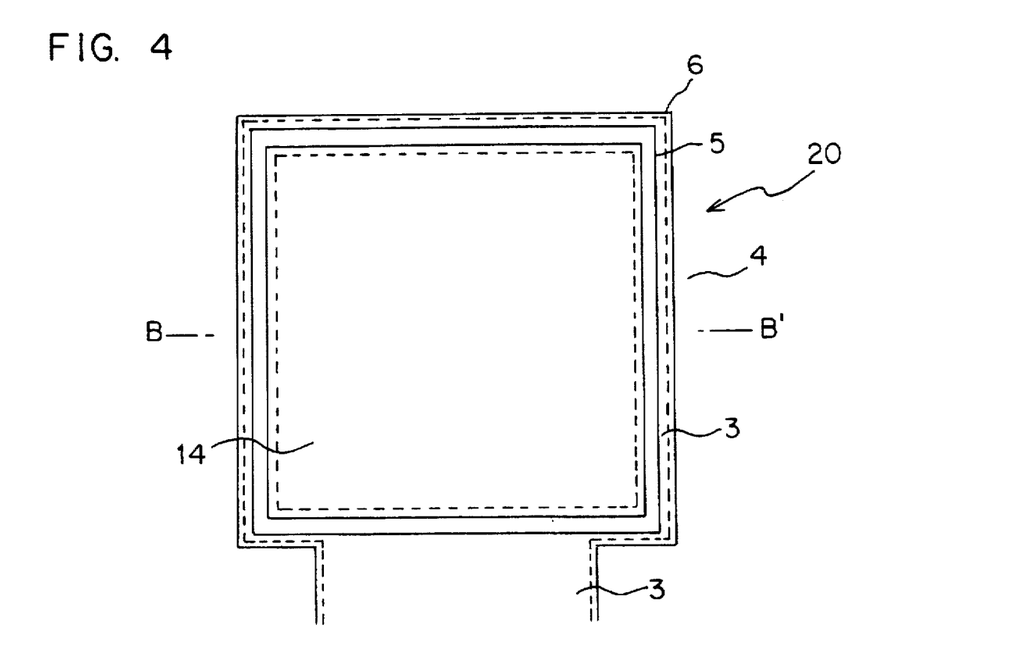
FIG. 4 schematically shows a layout pattern (a plane view) of s bonding pad portion of a semiconductor device of Embodiment 2.
Figure 5:
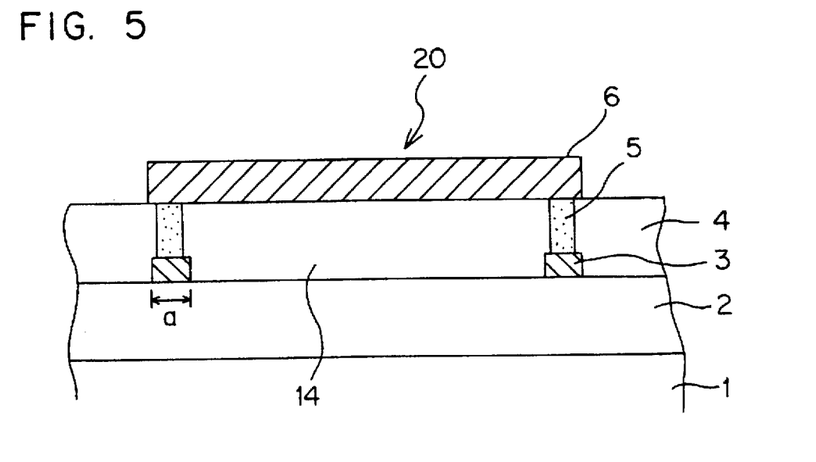
FIG. 5 schematically shows a cross-sectional view taken along a line B–B' in FIG. 4.

A second concrete embodiment of the present invention is shown in FIGS. 4 and 5. FIG. 4 schematically shows a layout pattern (a top plane view) of the bonding pad portion (20) of the second concrete embodiment of the semiconductor device according to the present invention, and FIG. 5 schematically shows a cross-sectional view taken along a line B–B' in FIG. 4.

As clearly seen from FIGS. 4 and 5, a wiring pattern of the first Al wiring layer (3) is provided only under the peripheral portion of the second Al wiring layer (6) so that an edge-form wiring layer having a predetermined width, and no first Al wiring layer is provided under a bonding pad central portion (14) including the bonding region therein (i.e. a region in which a wire (10) is to be contacted with the second wiring layer (6)) inside the peripheral portion so that there is formed a hollow space under the bonding pad central portion (14) (thus, the first wiring layer (3) has a relatively large opening through the layer corresponding to the central portion (14)). In addition, a pattern of the via hole (5) is so designed that the via hole is located only on the first Al wiring layer pattern (3) (namely, only beneath the peripheral of the second Al wiring layer (6)). These are the specific features of Embodiment 2. With respect to the other features of Embodiment 2, they are substantially the same as those of the embodiment as shown in FIG. 1.

In Embodiment 2, the first wiring layer (3) and the via hole (5), namely the rectangular edge-like wiring layer (a wiring layer which constitutes an edge portion of a rectangular shape and which has a predetermined width) and the via hole thereon, are located outside the bonding region.

The width ("a") of the first Al wiring layer (3) of the rectangular edge (see FIG. 5) may be in a range of from a few micrometers to 10 μm. In addition, a width of the groove of the via hole pattern may be almost the same as or smaller than the width of the first wiring layer. Usually, the width of the via hole groove may be substantially the same as that of a usual via hole which is used for connecting wiring layers formed in the semiconductor device other than the bonding pad portion. For example, the width may be such that a tungsten plug is normally formed in the semiconductor device (e.g. 0.3 to 1.5 μm). In the embodiment shown in the drawings, the via hole is in the groove-like form (thus, an elongated configuration), though it may be in the form of a plurality of the columns or the prisms (as shown in FIG. 1) evenly spaced from each other.

Figure 6:
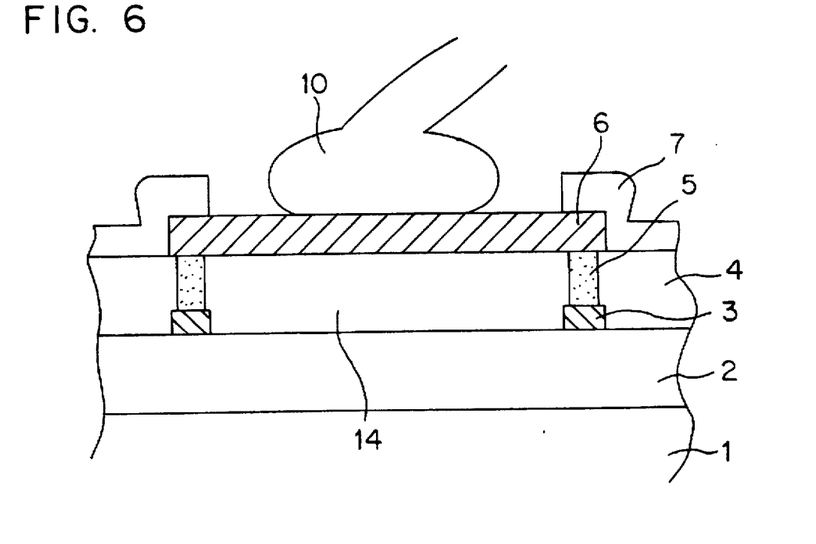
FIG. 6 schematically shows a cross-sectional view similar to FIG. 5 showing a state in which wire bonding is being carried out using the device of the Embodiment shown in FIG. 4.

In the case in which the structure as shown in FIG. 4 is employed, when wire bonding is carried out to a finally finished bonding pad as shown in FIG. 6, the second interlayer insulation layer (4) is not in a condition in which the insulation layer is sandwiched by the Al wiring layers since no Al wiring layer is present under the second Al wiring layer (6). That is, such a structure is substantially the same as the structure in which the bonding pad is formed using only the second wiring layer (6) as shown in FIG. 10, so that no crack occurs.

Further, since the via hole (5) is in the form of the groove (namely, including a horizontally elongated rectangular opening), an area and thus a width of the via hole which connects the first Al wiring layer and the second wiring layer may be made smaller in comparison with the via hole having the larger opening as in FIG. 9, so that a normal via hole structure is easily ensured.

Also, in this embodiment, the cracks thus do not occur and a bonding pad structure is obtained in which the wire (10) is tightly bonded to the second Al wiring layer (6). It is, of course, possible that a plurality of the column or the prism form via holes evenly spaced from each other are located in place of the groove like via hole.

Embodiment 3

Figure 7:
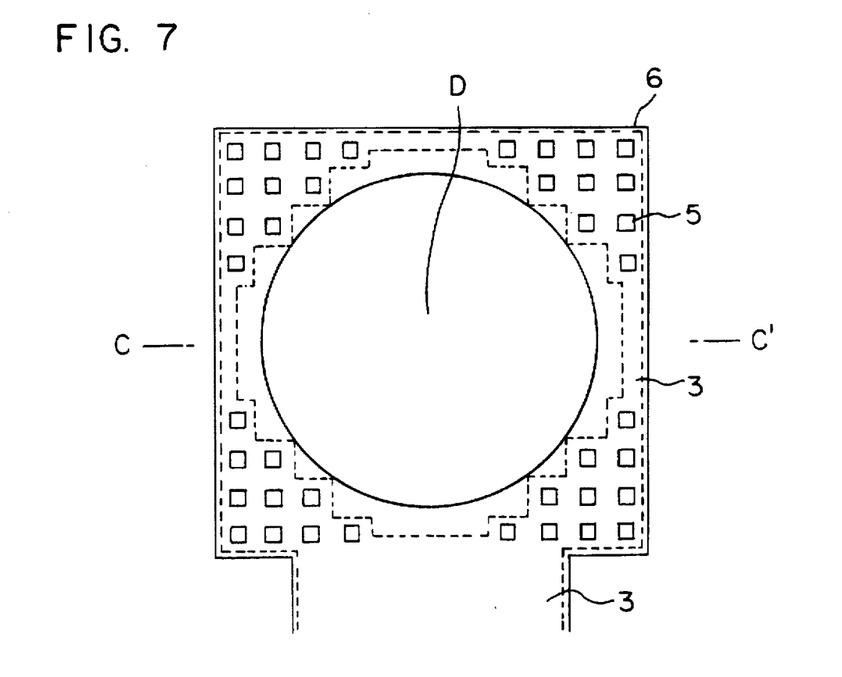
FIG. 7 schematically shows a layout pattern (a plane view) of a bonding pad portion of a semiconductor device of Embodiment 3.
Figure 8:
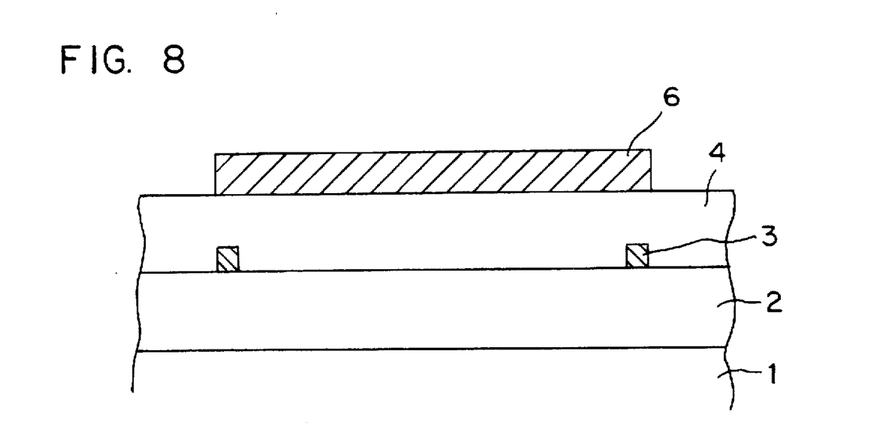
FIG. 8 schematically shows a cross-sectional view taken along a line C–C' in FIG. 7.

A third concrete embodiment of the present invention is shown in FIGS. 7 and 8. FIG. 7 schematically shows a layout pattern (a top plane view) of the bonding pad portion (20) of the third concrete embodiment of the semiconductor device according to the present invention, and FIG. 8 schematically shows a cross-sectional view taken along a line C–C' in FIG. 7.

As clearly seen from FIGS. 7 and 8, the second wiring layer is in a rectangular form, a pattern of the first Al wiring layer (3) so designed that it is hollow (or slotted) and no wiring layer is present under the bonding region, and that the via holes (5) are located in four corner portions of the bonding pad (20) on the first wiring layer (3), which are the specific features of Embodiment 3. With respect to the shape of the second wiring layer (6), it is to be noted that the shape is not necessarily rectangular in the other Embodiments. With respect to other features of Embodiment 3, they are substantially the same as those of the embodiment as shown in FIG. 4. Though the via holes are in the form of the prism (particular tetragonal prism), the via holes may be a plurality of horizontally elongated spaces (which is formed by laying down a standing pillar).

A certain region of the bonding pad portion (20) which is effectively functions for bonding upon the wire bonding is regarded to be an inside portion within a circle D (see FIG. 7) under consideration of the positional accuracy of the wire bonding. With respect to such a region, although it is strictly contemplated that the circle D includes the bonding region (and thus the bonding region is inside the circle D), there is practically no problem when a whole region of the circle D is regarded to correspond to the bonding region. Therefore, when the pattern of the via holes (5) is located outside the circle D and the first Al wiring layer (3) is formed only beneath the via holes (5), under the bonding region, no first Al wiring layer (3) is present beneath the second interlayer insulation layer (4). That is, the second interlayer insulation layer (4) is not sandwiched by the Al wiring layers, and thus no crack occurs in the interlayer insulation layer as in the structure of Embodiment 2.

In addition, since the four corner portions are used which substantially do nothing with the wire bonding in Embodiment 3, an area of the bonding pad is effectively used.

Thus, in this embodiment, no crack occurs and a structure is obtained in which the wire (10) is tightly bonded to the second Al wiring layer (6).

Although, in the above descriptions of the present invention including Embodiments 1 to 3, the structures are described as examples in which the two aluminum wiring layers are formed, it is, of course, possible to apply the structure of the present invention to other multilayered semiconductor devices each of which structure has three or more wiring layers.

The present invention is mainly characterized in the bonding pad structure itself and thus a material, a shape and a size thereof of each component of the semiconductor device such as the substrate, the wiring layer, the electrically conductive component and the interlayer insulation layer containing the electrically insulating component may be easily selected on the basis of the known knowledge in the art depending on a predetermined application of the semiconductor device. Similarly, a method of forming each component is easily carried out using the well-known technique in the art.

For example, although Embodiments 1 to 3 have been explained with reference to the multilayered structure using the aluminum wiring layers, some or all of the wiring layers may be made of a metal having a high melting point such as tungsten (W), titanium (Ti), molybdenum (Mo) and the like. In addition, it is of course that other multilayered structure provides the same functions and effects as described above when the present invention is applied thereto in which other multilayered structure tungsten silicide ($WSi_2$) wiring layers, titanium silicide ($TiSi_2$) wiring layers, molybdenum silicide ($MoSi_2$) wiring layers and polycrystalline silicon wiring layers and any combination thereof are laminated.

Effect of the Invention

When the first wiring layer pattern and the via hole pattern which is located thereon are considered according to the present invention, an amount of the material for the first wiring layer is decreased or the first wiring layer is so designed that it is not present under the bonding region, so that no crack is formed in the interlayer insulation layer, whereby the sufficiently tight bonding of the wire to the second wiring layer is achieved, which allows to provide the semiconductor device having the higher reliability.

What is claimed is:

1. A semiconductor device having a bonding pad portion of a multilayered wiring structure comprising at least first and second wiring layers and at least one interlayer insulating layer between the wiring layers which has a plurality of via holes filled with an electrically conductive component so as to electrically connect the wiring layers, characterized in that (1) the first wiring layer has a wiring pattern including a plurality of spaced apart portions, (2) the interlayer insulation layer is located on the first wiring layer and fills the slit portions of the wiring pattern, and the via hole contained in the interlayer insulation is located on the first wiring layer, and (3) the second wiring layer is formed on the interlayer insulation layer so that it is electrically connected with the first wiring layer through the plurality of via holes, and functions as a pad electrode for electrical input or output with the outside of the semiconductor device, wherein each spaced apart portion of the first wiring layer is connected to the second wiring layer through a via hole.

2. The semiconductor device according to claim 1, wherein the plurality of via holes are a plurality or pores formed through the interlayer insulation layer, and a geometric configuration of each pore is a column or a prism form or a horizontally elongated form.

3. The semiconductor device according to claim 1, wherein the spaced apart portions are separated by a plurality of horizontally elongated rectangular spaces through the first wiring layer which are filled with the electrically insulating component constituting the interlayer insulation layer.

4. A semiconductor device having a bonding pad portion of a multilayered wiring structure comprising at least a first and a second wiring layers and at least one interlayer insulation layer between the wiring layers which has at least one via hole filled with an electrically conductive component so as to electrically connect the wiring layers, characterized in that (1) the second wiring layer is formed on the interlayer insulation layer, and functions as a pad electrode having a bonding region for electrical input or output with the outside of the semiconductor device, (2) the via hole contained in the interlayer insulation layer is located beneath the second wiring layer outside the bonding region, and (3) the first wiring layer has a wiring pattern beneath the via hole, but it has no wiring pattern under the bonding region.

5. The semiconductor device according to claim 4, wherein the via hole is a plurality of pores formed through the interlayer insulation layer, and a geometric configuration of each pore is a column or a prism form or a horizontally elongated form.

6. The semiconductor device according to claim 4, wherein the via holes are formed beneath edge portions of the second wiring layer.

7. The semiconductor device according to claim 4, wherein the second wiring layer is substantially rectangular and the via holes are formed beneath four corner portions of the second wiring layer.

8. A bonding pad structure of a multilayered wiring arrangement comprising at least a first and a second wiring layers and at least one interlayer insulation layer between the wiring layers which has a plurality of via holes filled with an electrically conductive component so as to electrically connect the wiring layers, characterized in that (1) the first wiring layer has a wiring pattern including a plurality of spaced apart portions, (2) the interlayer insulation layer is located on the first wiring layer and fills the slit portions of the wiring pattern, and the via hole contained in the interlayer insulation is located on the first wiring layer, and (3) the second wiring layer is formed on the interlayer insulation layer so that it is electrically connected with the first wiring layer through the plurality of via holes, and functions as a pad electrode for electrically input or output with the outside of a semiconductor device, wherein each spaced apart portion of the first wiring layer is connected to the second wiring layer through a via hole.

9. The bonding pad structure according to claim 8, wherein the plurality of via holes are a plurality of pores formed through the interlayer insulation layer, and a geometric configuration of each pore is a column or a prism form or a horizontally elongated form.

10. The bonding pad structure according to claim 8, wherein the spaced apart portions are separated by a plurality of horizontally elongated rectangular spaces through the first wiring layer which are filled with the electrically insulating component constituting the interlayer insulation layer.

11. A bonding pad structure of a multilayered wiring arrangement and comprising at least a first and a second wiring layers and at least one interlayer insulation layer between the wiring layers which has at least one via hole filled with an electrically conductive component so as to electrically connect the wiring layers, characterized in that (1) the second wiring layer is formed on the interlayer insulation layer, and functions as a pad electrode having a bonding region for electrical input or output with the outside of the semiconductor device, (2) the via hole contained in the interlayer insulation layer is located beneath the second wiring layer outside the bonding region, and (3) the first wiring layer has a wiring pattern beneath the via hole, but it has no wiring pattern under the bonding region.

12. The bonding pad structure according to claim 11, wherein the via hole is a plurality of pores formed through the interlayer insulation layer, and a geometric configuration of each pore is a column or a prism form or a horizontally elongated form.

13. The bonding pad structure according to claim 11, wherein the via holes are formed beneath edge portions of the second wiring layer.

14. The bonding pad structure according to claim 11, wherein the second wiring layer is substantially rectangular and the via holes are formed beneath four corner portions of the second wiring layer.

* * * * *